United States Patent
Liu et al.

(10) Patent No.: US 7,519,086 B2
(45) Date of Patent: Apr. 14, 2009

(54) METHOD AND SYSTEM TO MEASURE DATA PACKET JITTER

(75) Inventors: Guangtian Liu, Cedar Park, TX (US); Jennifer Lynne Joy, Austin, TX (US); John A. Sicich, Austin, TX (US)

(73) Assignee: AT&T Intellectual Property I. L.P., Reno, NV (US)

( * ) Notice: Subject to any disclaimer, the term of this patent is extended or adjusted under 35 U.S.C. 154(b) by 708 days.

(21) Appl. No.: 10/918,221

(22) Filed: Aug. 13, 2004

(65) Prior Publication Data

US 2006/0034339 A1    Feb. 16, 2006

(51) Int. Cl.
*H04J 3/06*    (2006.01)
(52) U.S. Cl. .......... 370/516; 370/473; 370/474
(58) Field of Classification Search ...... 370/238.1, 370/352, 395.21, 229–236, 516–519, 468–474; 709/233–235
See application file for complete search history.

(56) References Cited

U.S. PATENT DOCUMENTS

| | | | | |
|---|---|---|---|---|
| 6,091,742 A * | 7/2000 | Bassat et al. | .................. | 370/516 |
| 6,868,094 B1 * | 3/2005 | Bordonaro et al. | .......... | 370/516 |
| 6,956,819 B1 * | 10/2005 | Yamada et al. | .............. | 370/230 |
| 7,289,535 B2 * | 10/2007 | Odman | ........................ | 370/473 |
| 7,295,520 B2 * | 11/2007 | Lee et al. | ..................... | 370/236 |
| 2003/0016627 A1 | 1/2003 | MeLampy et al. | | |
| 2003/0031185 A1 * | 2/2003 | Kikuchi et al. | .............. | 370/400 |
| 2003/0145100 A1 * | 7/2003 | Marchetto et al. | .......... | 709/233 |
| 2004/0095893 A1 | 5/2004 | Goringe et al. | | |
| 2004/0233931 A1 * | 11/2004 | Cohen | ......................... | 370/468 |
| 2005/0270982 A1 * | 12/2005 | McBeath | ..................... | 370/252 |

FOREIGN PATENT DOCUMENTS

EP    1 023 788 B1    7/2004

* cited by examiner

*Primary Examiner*—Aung S Moe
*Assistant Examiner*—Habte Mered
(74) *Attorney, Agent, or Firm*—Toler Law Group

(57) ABSTRACT

A first data packet is sent through a system under measurement (SUM) from a sender side to a receiver side. A time distance d between the first data packet and a second data packet consecutive thereto in a packet flow is observed on the sender side. A value of d is written into a payload of the second data packet. The second data packet is sent through the SUM. The first data packet and the second data packet are received on the receiver side. A time difference D between the first data packet and the second data packet is observed on the receiver side. The value of d is extracted, at the receiver side, from the payload of the second data packet. The jitter is determined based on the value of d extracted from the payload of the second data packet and the value of the time difference D.

22 Claims, 3 Drawing Sheets

METHOD AND SYSTEM TO MEASURE DATA PACKET JITTER

FIELD OF THE INVENTION

The present disclosure relates to methods and systems for measuring data packet jitter.

DESCRIPTION OF THE RELATED ART

Jitter is an important performance indicator of network devices or network implementation. However, many current test equipment networks and test equipment vendors do not provide jitter measurement functionality in their equipment.

BRIEF DESCRIPTION OF THE DRAWINGS

The present invention is pointed out with particularity in the appended claims. However, other features are described in the following detailed description in conjunction with the accompanying drawings in which:

DETAILED DESCRIPTION OF THE DRAWINGS

Disclosed herein are embodiments of a method to measure packet delay jitter in data networks. The method works with same-size and variable-size packet flows. Methods of dealing with packet loss and packet out-of-sequence scenarios are also disclosed herein.

Figure 1:
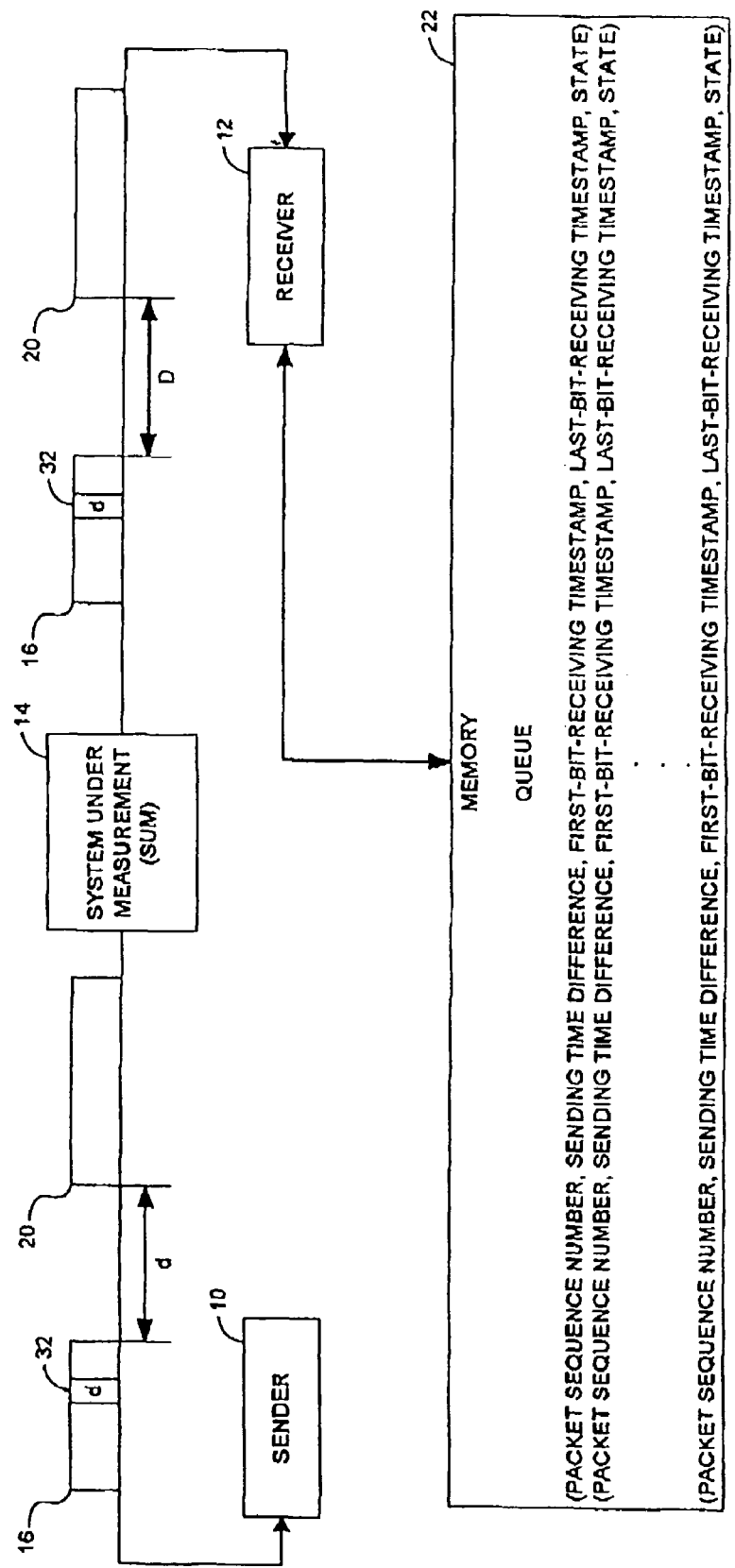
FIG. 1 is a block diagram of an embodiment of a system to measure packet delay jitter.

FIG. 1 is a block diagram of an embodiment of a system to measure packet delay jitter. The system comprises a sender 10 which transmits a flow of data packets to a receiver 12 through a system under measurement (SUM) 14. The SUM may comprise a single network device, such as a router from Cisco Systems, Inc., or multiple network devices such as a network implemented therewith. The sender 10 may comprise a device separate from the SUM 14, or may be part of the SUM 14 such as an interface of the SUM 14. Similarly, the receiver 12 may comprise a device separate from the SUM 14, or may be part of the SUM 14 such as another interface of the SUM 14.

The data packets in the flow are ordered by an index i such that the first packet is indicated by i=1, the second packet is indicated by i=2, the third packet is indicated by i=3, and so on. In general, the index is ordered such that a packet$_{(i+1)}$ (indicated by reference numeral 16) is transmitted after a packet$_i$ (indicated by reference numeral 20) and is consecutive to the packet$_i$ 20 in the packet flow.

A time difference $d_i$ is defined as a distance in time between the packet$_i$ 20 and the packet$_{(i+1)}$ 16 as observed by the sender 10 side of the SUM 14. A time difference $D_i$ is defined as a distance in time between the packet$_i$ 20 and the packet$_{(i+1)}$ 16 as observed by the receiver 12 side of the SUM 14. By definition, the jitter $J_i$ between the packet$_i$ 20 and the packet$_{(i+1)}$ 16 in this flow, which is introduced by the SUM 14, is $J_i = |D_i - d_i|$.

The receiver 12 comprises a memory 22 which is to store packet sequence numbers, $d_i$ values, first-bit-receiving timestamps, last-bit-receiving timestamps and packet state values for up to n previously-received packets. In one embodiment, the memory 22 stores the last n packet sequence numbers, $d_i$ values, first-bit-receiving timestamps, last-bit-receiving timestamps and packet state values in a fixed-length, first-in first-out (FIFO) queue. The value of n can be determined based on the upper limits of jitter of the SUM 14.

Embodiments of methods to measure the packet data jitter are described with reference to FIG. 2, which is a flow chart of an embodiment of a method performed by the sender 10, and FIG. 3, which is a flow chart of an embodiment of a method performed by the receiver 12.

As indicated by block 25, the method comprises sending a first packet in the packet flow, namely packet$_1$, through the SUM 14 from the sender 10 side to the receiver 12 side.

Figure 2:
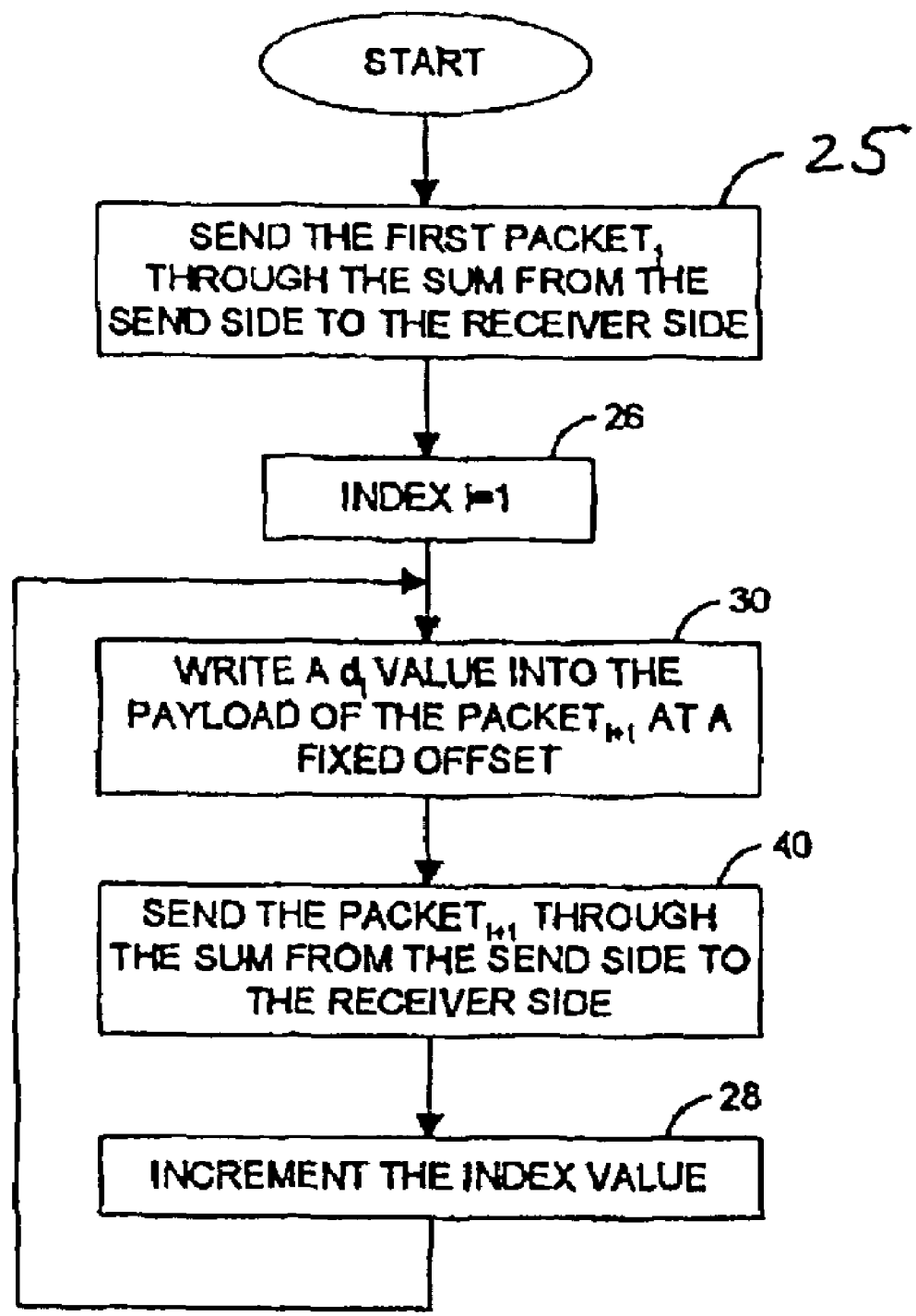
FIG. 2 is a flow chart of an embodiment of a method performed by a sender to measure packet jitter using the system of FIG. 1.

The remainder of the method in FIG. 2 is illustrated for a general value i of the index, and thus is initially performed for a starting index value of 1 (block 26), and repeated as i is incremented (block 28) for each subsequent packet in the packet flow. The method can be used to measure packet jitter in data flows including, but not limited to, Internet Protocol (IP) packet flows and MultiProtocol Label Switching (MPLS) packet flows.

As indicated by block 30, the method comprises writing a value of the time difference $d_i$ into a payload of the packet$_{(i+1)}$ 16 at a fixed offset. The act of writing is performed at the sender 10 side of the SUM 14. To enable a measurement of jitter in the case of packet fragmentation (i.e. the SUM 14 breaks the packet$_{(i+1)}$ 16 into a plurality of smaller packets), multiple copies of the $d_i$ value may be written into the payload of the packet$_{(i+1)}$ 16 at multiple offsets.

As indicated by block 40, the method comprises sending the packet$_{(i+1)}$ 16 through the SUM 14 from the sender 10 side to the receiver 12 side.

The index i is incremented in block 28, and flow of the method is directed back to block 30 to process a subsequent packet.

Figure 3:
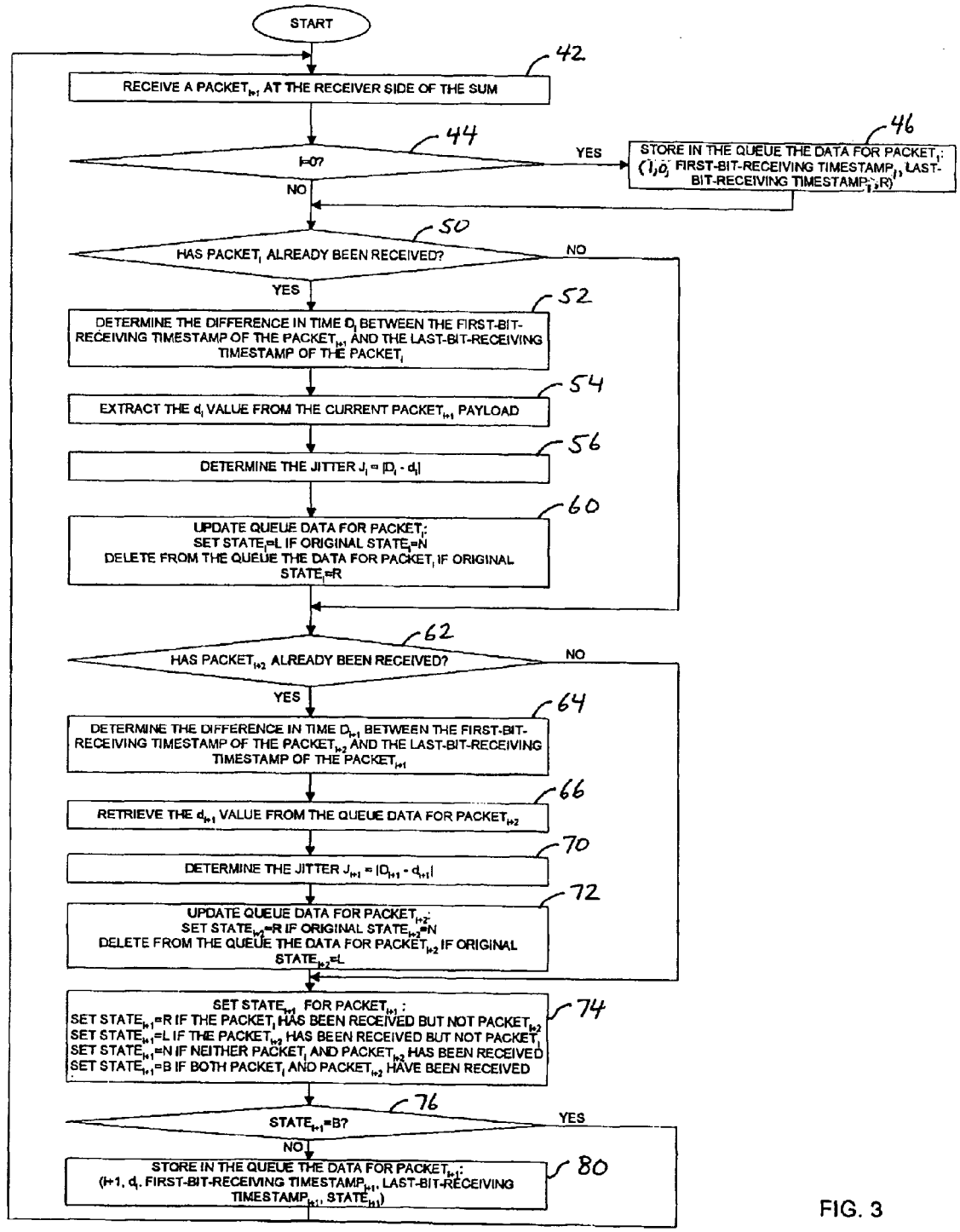
FIG. 3 is a flow chart of an embodiment of a method performed by a receiver to measure packet jitter using the system of FIG. 1.

Referring now to FIG. 3, the method comprises receiving a packet at the receiver 12, as indicated by block 42. Without loss of generality, consider the packet$_{(i+1)}$ 16 being received in this act. The packet$_{(i+1)}$ 16 may be received either in sequence (i.e. the packet$_i$ 20 was the most recent packet received before receiving the packet$_{(i+1)}$ 16), out-of-sequence (i.e. the SUM 14 causes the packet 20 not to be the most recent packet received before receiving the packet$_{(i+1)}$ 16), or in fragments (i.e. the SUM 14 breaks the packet$_{(i+1)}$ 16 into a plurality of smaller packets). The following acts of processing the received packets is adaptive to handle out-of-sequence packets and packet loss.

As indicated by blocks 44 and 46, if the index i is equal to zero, which is the case when the packet$_1$ is received in block 42, then data associated with the packet$_1$ is stored in the queue. The data comprises a value of 1 associated with a packet sequence number, a value of zero associated with a sending time difference d because there is no value of d associated with the packet$_1$, a first-bit-receiving timestamp$_1$, a last-bit-receiving timestamp$_1$, and a state value R.

As indicated by block 50, the method comprises determining if a packet immediately prior to the currently-received packet in the sequence has already been received. Since the currently-received packet is the packet$_{(i+1)}$ 16, it is determined whether or not the packet$_i$ 20 has already been received. In one embodiment, this act comprises determining if the sequence number immediately prior to the sequence number (i+1), which is sequence number i, is stored in the queue.

If a match on sequence number i is found in the queue, the receiver 12 performs an act of determining a time difference $D_i$ between receiving the current packet and the packet sent immediately prior thereto, as indicated by block 52. Since the current packet is the packet$_{(i+1)}$ 16, the time difference $D_i$ between receiving the packet$_i$ 20 and the packet$_{(i+1)}$ 16 is determined. The time difference $D_i$ is the difference between the first-bit-receiving timestamp of the packet$_{(i+1)}$ 16 and the last-bit-receiving timestamp of the packet$_i$ 20. The last-bit-receiving timestamp corresponding to the packet$_i$ 20 is retrieved from the queue.

As indicated by block 54, the method comprises the receiver 12 extracting the d value from the payload of the current packet. Since the current packet is the packet$_{(i+1)}$ 16, the $D_i$ value is retrieved from the payload of the packet$_{(i+1)}$ 16. If the packet$_{(i+1)}$ 16 has been fragmented by the SUM 14, one of the multiple copies of the $d_i$ value that exist in the fragment may be extracted by the receiver 12.

As indicated by block 56, the method comprises determining the jitter J based on a difference between D and d, e.g. J=|D−d|. Since the current packet is the packet$_{(i+1)}$ 16, the jitter $J_i$ is determined based on a difference between $D_i$ and $d_i$, e.g. $J_i=|D_i-d_i|$. In this way, the jitter $J_i$ is determined at the receiver 12 side of the SUM 14 based on the value of $D_i$ as measured by the receiver 12 and the value of $D_i$ as separately measured by the sender 10. Beneficially, the measurement of jitter $J_i$ can be determined regardless of whether the size of packets 20 is the same as or differs from the size of the packet$_{(i+1)}$ 16.

As indicated by block 60, the method comprises updating queue data for the packet$_i$ 20. This act comprises setting a state$_i$ to a value of L if the original state$_i$ has a value of N. This act also comprises deleting, from the queue, the data for the packet sent immediately prior to the current packet if the original state of the immediately prior packet has a value of R. Since the current packet is the packet$_{(i+1)}$ 16, the packet$_i$ 20 is deleted from the queue if original state$_i$=R.

As indicated by block 62, the method comprises determining if a packet immediately after the currently-received packet in the sequence has already been received. Since the currently-received packet is the packet$_{(i+1)}$ 16, it is determined whether or not the packet$_{(i+2)}$ has already been received. In one embodiment, this act comprises determining if the sequence number immediately after the sequence number (i+1), which is sequence number (i+2), is stored in the queue.

If a match on sequence number i+2 is found in the queue, the receiver 12 performs an act of determining a time difference D between receiving the current packet and the packet sent immediately after, as indicated by block 64. Since the current packet is the packet$_{(i+1)}$ 16, the time difference $D_{i+1}$ between receiving the packet$_{(i+1)}$ 16 and the packet$_{(i+2)}$ is determined. The time difference $D_{i+1}$ is the difference between the first-bit-receiving timestamp of the packet$_{(i+2)}$ and the last-bit-receiving timestamp of the packet$_{(i+1)}$ 16. The first-bit-receiving timestamp corresponding to the packet$_{(i+2)}$ is retrieved from the queue.

As indicated by block 66, the method comprises the receiver 12 retrieving the $d_{(i+1)}$ value from queue data for the packet$_{(i+2)}$.

As indicated by block 70, the method comprises determining the jitter $J_{i+1}$ based on a difference between $D_{i+1}$ and $d_{i+1}$, e.g. $J_{i+1}=|D_{i+1}-d_{i+1}|$.

As indicated by block 72, the method comprises updating queue data for the packet$_{(i+2)}$. This act comprises setting a state$_{i+2}$ to a value of R if its original state$_{i+2}$ has a value of N. This act also comprises deleting, from the queue, the data for the packet$_{(i+2)}$ if its original state$_{i+2}$ has a value of L.

As indicated by block 74, a value of a state$_{i+1}$ is set for the packet$_{(i+1)}$. It is noted that an alternative flow path to this act occurs if a match on sequence number i+2 was not found in the queue in block 62.

The state$_{i+1}$ is set to R if the packet$_i$ has been received but the packet$_{(i+2)}$ has not been received. The state$_{i+1}$ is set to L if the packet$_{(i+2)}$ has been received but the packets has not been received. The state$_{i+1}$ is set to N if neither the packet$_i$ nor the packet$_{(i+2)}$ have been received. The state$_{i+1}$ is set to B if both the packets and the packet$_{(i+2)}$ have been received.

As those having ordinary skill will appreciate, any four different values can be used to indicate four different states, which in the herein-disclosed implementation are indicated by values of R, L, N or B.

As indicated by blocks 76 and 80, the method comprises storing, in the queue, data for the current packet$_{(i+1)}$ 16 if the state$_{i+1}$ has any value but B (i.e. the state$_{i+1}$ has a value of R, L or N). The data comprises a value of (i+1) associated with a packet sequence number, the sending time difference $d_i$, a first-bit-receiving timestamp$_{i+1}$, a last-bit-receiving timestamp$_{i+1}$, and a value of the state$_{i+1}$. This act may comprise pushing the aforementioned data to the queue. If an overflow of the queue occurs, the jitter for the discarded head packet has exceeded the upper limit.

Flow of the method is directed back to block 42 wherein another packet is received and processed to measure another jitter value.

As previously stated, the herein-described jitter measurement method is transparent to packet sizes. Another benefit is that the method is transparent to interface speed. For example, the sender 10 and the receiver 12 may be different types of interfaces operating at different line speeds. The herein-described jitter measurement method is easy to implement, and modest resources are used on either the sender 10 or the receiver 12 sides of the SUM 14. Further, if the clocks on the sender and receiver sides of the SUM have suitable resolution and precision, the herein-described jitter measurement method provides accurate measures of jitter even if the clocks are not synchronized.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of measuring jitter caused by a system under measurement (SUM), the method comprising:

sending a first data packet through the SUM from a sender side to a receiver side;

determining a sender side time difference, wherein the sender side time difference is a time difference between the first data packet and a second data packet consecutive thereto in a data packet flow as observed on the sender side of the SUM;

writing multiple copies of the sender side time difference into a payload of the second data packet at multiple offsets;

sending the second data packet through the SUM from the sender side to the receiver side;

determining a receiver side time difference, wherein the receiver side time difference is a time difference between the first data packet and the second data packet as observed on the receiver side of the SUM;

extracting one of the multiple copies of the sender side time difference from the payload of the second data packet; and determining the jitter on the receiver side of the SUM based on the sender side time difference extracted from the payload of the second data packet and the receiver side time difference.

2. The method of claim 1 wherein determining the jitter is based on a difference between the receiver side time difference and the sender side time difference.

3. The method of claim 1 wherein the receiver side time difference is a difference between a first-bit-receiving timestamp of the second data packet and a last-bit-receiving timestamp of the first data packet.

4. The method of claim 1 further comprising:
storing, in a memory on the receiver side, a first packet sequence number and first-bit-receiving and last-bit-receiving timestamps for the first data packet after receiving the first data packet but before receiving the second data packet.

5. The method of claim 1 further comprising:
storing, in a memory on the receiver side, a first packet sequence number and a first timestamp for the first data packet after receiving the first data packet but before receiving the second data packet; and
after receiving the second data packet, determining that the first packet sequence number is stored in the memory and retrieving the first timestamp corresponding thereto in the memory;
wherein the receiver side time difference is based on a difference between a second timestamp for the second data packet and the first timestamp retrieved from the memory.

6. The method of claim 5 further comprising:
storing, in the memory on the receiver side, a second packet sequence number and the second timestamp for the second data packet after receiving the second data packet.

7. The method of claim 6 further comprising: deleting, from the memory on the receiver side, the first packet sequence number and the first timestamp for the first data packet after retrieving the first timestamp from the memory.

8. The method of claim 1 wherein a size of the first data packet differs from a size of the second data packet.

9. The method of claim 1 wherein the sender side comprises a first interface of the SUM, and the receiver side comprises a second interface of the SUM.

10. The method of claim 9 wherein the first interface and the second interface operate at different line speeds.

11. The method of claim 1, wherein the second data packet is fragmented into a plurality of smaller packets at the SUM, and the sender side time difference is extracted from one of the plurality of smaller packets to determine jitter.

12. A system for measuring jitter caused by a system under measurement (SUM), the system comprising:
a sender device to send a first data packet to a sender side of the SUM, determine a sender side time difference, wherein the sender side time difference is a time difference between the first data packet and a second data packet consecutive thereto in a packet flow, write multiple copies of the sender side time difference into a payload of the second data packet at multiple offsets, and send the second data packet to the sender side of the SUM; and a receiver device to receive the first data packet on a receiver side of the SUM, to receive the second data packet on the receiver side of the SUM, to determine a receiver side time difference, wherein the receiver side time difference is a time difference between the first data packet and the second data packet as observed on the receiver side of the SUM, to extract one of the multiple copies of the sender side time difference from the payload of the second data packet, and to determine the jitter at the receiver device based on the sender side time difference extracted from the payload of the second data packet and the receiver side time difference.

13. The system of claim 12 wherein the jitter is based on a difference between the receiver side time difference and the sender side time difference.

14. The system of claim 12 wherein the receiver side time difference is a difference between a first-bit-receiving timestamp of the second data packet and a last-bit-receiving timestamp of the first data packet.

15. The system of claim 12 wherein the receiver device is to store, in a memory, a first packet sequence number and first-bit-receiving and last-bit-receiving timestamps for the first data packet after receiving the first data packet but before receiving the second data packet.

16. The system of claim 12 wherein the receiver device is to:
store, m a memory, a first packet sequence number and a first timestamp for the first data packet after receiving the first data packet but before receiving the second data packet; and
after receiving the second data packet, determine that the first packet sequence number is stored in the memory and retrieve the first timestamp corresponding thereto in the memory;
wherein the receiver side time difference is based on a difference between a second timestamp for the second data packet and the first timestamp retrieved from the memory.

17. The system of claim 16 wherein the receiver device is to store, in the memory, a second packet sequence number and the second timestamp for the second data packet after receiving the second data packet.

18. The system of claim 17 wherein the receiver device is to delete, from the memory, the first packet sequence number and the first timestamp for the first data packet after retrieving the first timestamp from the memory.

19. The system of claim 12 wherein a size of the first data packet differs from a size of the second data packet.

20. The system of claim 12 wherein the sender device comprises a first interface of the SUM, and the receiver device comprises a second interface of the SUM.

21. The system of claim 20 wherein the first interface and the second interface operate at different line speeds.

22. The system of claim 12, wherein the second data packet is fragmented into a plurality of smaller packets at the SUM, and the receiver device extracts the sender side time difference from one of the plurality of smaller packets to determine jitter.

* * * * *